(12) United States Patent
Shin et al.

(10) Patent No.: US 8,558,636 B2
(45) Date of Patent: Oct. 15, 2013

(54) PACKAGE EMBEDDED EQUALIZER

(75) Inventors: Jaemin Shin, Gilbert, AZ (US); Pascal A. Meier, Santa Clara, CA (US); Telesphor Kamgaing, Chandler, AZ (US); Kemal Aygun, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 831 days.

(21) Appl. No.: 11/694,765

(22) Filed: Mar. 30, 2007

(65) Prior Publication Data
US 2008/0238587 A1 Oct. 2, 2008

(51) Int. Cl.
*H04B 3/04* (2006.01)
*H05K 1/18* (2006.01)
*H03G 11/04* (2006.01)

(52) U.S. Cl.
USPC ............ 333/28 R; 333/247; 361/761; 375/229

(58) Field of Classification Search
USPC ......... 333/28 R; 375/229; 361/761, 762, 763, 361/764
See application file for complete search history.

(56) References Cited

U.S. PATENT DOCUMENTS

| | | | |
|---|---|---|---|
| 1,511,013 A | 10/1924 | Affel | |
| 1,603,305 A | 10/1926 | Zobel | |
| 1,686,792 A | 10/1928 | Black | |
| 1,743,132 A | 1/1930 | Green | |
| 2,054,657 A | 9/1936 | Mayer | |
| 2,096,027 A | 10/1937 | Bode | |
| 2,242,878 A | 5/1941 | Bode | |
| 2,719,270 A | 9/1955 | Ketchledge | |
| 4,132,958 A | 1/1979 | Addis et al. | |
| 4,146,844 A | 3/1979 | Quinn | |
| 5,157,576 A * | 10/1992 | Takaya et al. | 361/321.2 |
| 6,222,427 B1 * | 4/2001 | Kato et al. | 333/185 |
| 6,646,519 B2 * | 11/2003 | Sperber | 333/28 R |
| 6,757,327 B1 | 6/2004 | Fiedler | |
| 7,394,331 B2 | 7/2008 | Yeung et al. | |
| 2003/0141941 A1 * | 7/2003 | Ozawa et al. | 333/28 R |
| 2003/0141942 A1 * | 7/2003 | McMorrow et al. | 333/28 R |
| 2005/0232346 A1 * | 10/2005 | Riggsby et al. | 375/229 |
| 2006/0243332 A1 * | 11/2006 | Harvey et al. | 137/614.04 |
| 2007/0253495 A1 * | 11/2007 | Kim | 375/259 |
| 2007/0268073 A1 * | 11/2007 | Suzaki et al. | 330/295 |
| 2009/0206962 A1 * | 8/2009 | Chou et al. | 333/28 R |

OTHER PUBLICATIONS

Wikipedia, "Electronic Packaging", [online] Last Modified Oct. 31, 2010, [retrieved on Nov. 22, 2010], retrieved from the Internet at <URL: http://en.wikipedia.org/wiki/Electronic_Packaging>, 4 pp.

(Continued)

*Primary Examiner* — Dean O Takaoka
*Assistant Examiner* — Alan Wong
(74) *Attorney, Agent, or Firm* — Konrad Raynes Davda & Victor LLP (57) ABSTRACT

A passive equalizer circuit is embedded within a substrate of a package containing an integrated circuit. It is believed that substantial reduction in uneven frequency dependent loss may be achieved for interconnects interconnecting the integrated circuit with other integrated circuits on a printed circuit board. Other aspects are described and claimed.

21 Claims, 4 Drawing Sheets

(56) References Cited

OTHER PUBLICATIONS

Wikipedia, "Integrated Circuit Packaging", [online] Last Modified Oct. 1, 2010, [retrieved on Nov. 22, 2010], retrieved from the Internet at <URL: http://en.wikipedia.org/wiki/Integrated_Circuit_Packaging>, 3 pp.

Chickamenahalli, S.A. et al., "RF Packaging and Passives: Design, Fabrication, Measurement and Validation of Package Embedded Inductors," IEE Transactions on Advanced Packaging, vol. 28, No. 4, Nov. 2005, 9 pp.

Kamgaing, T. et al., "Future Packaging Technologies for Wireless Communication Systems," Intel Technology Journal, vol. 9, Issue 4, Nov. 9, 2005, 14 pp.

Sun, R., et al., "A Low-Power, 20-Gb.s Continuous-Time Adaptive Passive Equalizer," IEEE ISCAS, 2005, 4 pp.

Ulrich, R.K. et al., "Integrated Passive Component Technology", IEEE Press, Wiley Interscience, 2003.

\* cited by examiner

PACKAGE EMBEDDED EQUALIZER

BACKGROUND

Electronic devices such as computers, televisions, telephones and the like typically have several integrated circuits, each integrated circuit being formed on a semiconductor die and packaged in a protective package. The packages containing the integrated circuits are usually mounted on circuit boards with conductors printed or otherwise fabricated onto the circuit boards to interconnect the input and output terminals of the integrated circuit packages.

As the signaling rates between integrated circuits such as central processing units and other integrated circuits on the circuit board have increased to higher and higher frequencies, the frequency response of the circuit board interconnects may become uneven. As a consequence, high speed interconnects in lossy channels may suffer from unequal frequency-dependent loss, which can result in degraded signal integrity. For example, serial point-to-point interconnects such as those used in Peripheral Component Interconnect Express (PCIe) busses which typically utilize high-speed channels, may be susceptible to unequal frequency-dependent loss, particularly for the longer interconnects. The details of the Peripheral Component Interconnect Express standard are explained in greater detail in the Peripheral Component Interconnect Express Base 2.0 Specification, published Jan. 15, 2007.

One technique for reducing unequal frequency-dependent loss is to reduce the length of the interconnect between integrated circuit packages. However, due to system constraints, reduction of interconnect length may not be an available option. Repeater circuits may be used to reduce the length of an individual channel. However, repeater circuits may increase latency, circuit complexity and power consumption.

Another approach is to use a low loss material which can reduce unequal frequency-dependent loss. However, such low loss materials can significantly increase manufacturing costs.

Circuits known as "equalizers" may also be used to "equalize" the frequency dependent loss of a particular communication channel on a printed circuit board. One type of equalizer circuit is an active circuit which includes transistors which may be fabricated directly on the die of the integrated circuit itself. One such active equalizer circuit is known as a discrete-time filter and can be integrated in the TX (Transmitter) or RX (Receiver) portion of the integrated circuit. Some discrete-time filter active equalizer circuits have programmable equalization taps to provide the flexibility of handling a variety of loss profiles which may be encountered. However, active equalizer circuits often incur increased power consumption and latency.

In addition to active equalizer circuits, passive equalizer circuits using passive components such as inductors, capacitors and resistors are also known. Such equalizers, often referred to as continuous-time linear equalizers (CLEs), can equalize the frequency-dependent loss of an interconnect by suppressing low-frequency signals and passing high-frequency signals in a manner similar to that of a high-pass filter. The use of passive components can reduce power dissipation and latency due to the absence of active components. Passive equalizers may be fabricated on the die itself. Such on-die passive equalizers often can be tuned for particular applications through legging of resistors, capacitors or other components. It is also known to place passive equalizers on the printed circuit board using discrete components, that is, discrete resistors, capacitors and inductors.

DETAILED DESCRIPTION OF THE DRAWINGS

Figure 1:
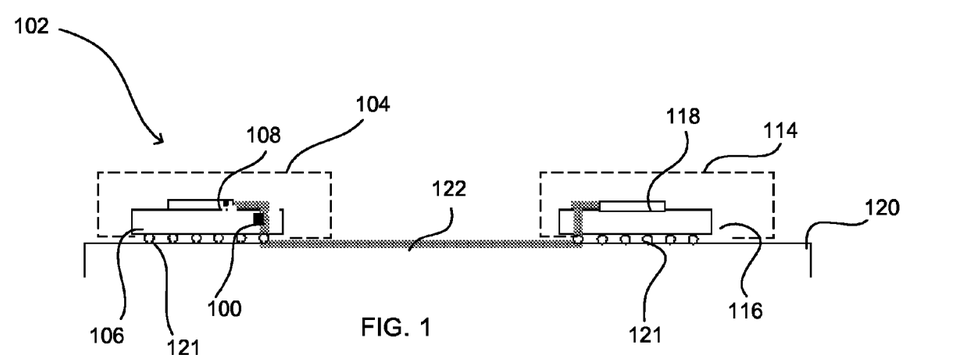
FIG. 1 is a schematic diagram of a system employing a package embedded equalizer in accordance with one embodiment of the present description.

A system employing a package embedded passive equalizer 100 in accordance with one embodiment of the present description, is indicated generally at 102 in FIG. 1. The system 102 includes a first package 104, that is, an integrated circuit protective package, which includes a package substrate 106 and a die 108 having a first integrated circuit fabricated on the die 108. The die 108 is supported by the package substrate 106 and is otherwise packaged within the package 104.

In accordance with one aspect of the present description, a passive equalizer 100 is embedded within the substrate 106 of the package 104 and is electrically coupled to the integrated circuit of the die 108. For example, the passive equalizer 100 embedded within the substrate 106 may be electrically coupled to the TX (Transmitter) or RX (Receiver) portion of the integrated circuit. In one aspect, such a package embedded passive equalizer can obviate using on-die or printed circuit board areas for equalizer circuits, freeing the on-die or printed circuit board areas for other applications. It is appreciated that other aspects in addition to this aspect or instead of this aspect, may be realized by employing a package embedded passive equalizer in accordance with the present description.

In the example of FIG. 1, the system 102 further includes a second package 114 which includes a package substrate 116 and a die 118 having a second integrated circuit fabricated on the die 118. The die 118 is supported by the package substrate 116 and is otherwise packaged within the package 114.

The packages 104 and 114 are disposed on a printed circuit board 120 and are connected to various terminals, interconnects and other conductors of the printed circuit board 120 by terminals 121 extending from the bottom faces of the packages 104, 11. The terminals 121 may be any type of conductor including land gate arrays (LGA), ball gate arrays (BGA), pins, etc.

An interconnect 122 disposed on the printed circuit board interconnects the first and second integrated circuits of the dies 108 and 118, respectively, through the terminals 121 and internal conductors of the packages 104 and 114 as shown in FIG. 1. The interconnect 122 may include one or more conductors, depending upon the particular application. For example, the interconnect 122 may be a differential microstrip line. It is appreciated that other types of interconnects may be utilized as well including single conductor interconnects. The passive equalizer 100 embedded in the substrate 106 of the package 104 is electrically coupled to the printed circuit board interconnect 122 and is adapted to compensate frequency dependent signal loss on the interconnect 122.

In the embodiment of FIG. 1, a single package embedded passive equalizer 100 is depicted. However, it is appreciated that a package substrate for an integrated circuit may have more such package embedded passive equalizers 100, depending upon the particular application. For example, a package containing a multi-processor for a server application may have 40 to 80 or more passive equalizers 100 embedded in the substrate of the package, each equalizer being associated with one or more interconnects. Other applications may have fewer or more package embedded passive equalizers, depending upon the circumstances of those other applications.

The interconnect 122 may for example, be a part of a bus such as a front side bus (FSB) or system bus which typically carries information signals between the central processing unit (CPU) and other devices within the system such as random access memory (RAM), video cards, expansion cards, hard disks, the memory containing the system BIOS, etc. Some computers have a memory cache external to the CPU connected via a back side bus. Frequently, the back side bus permits the cache memory to be accessed faster than the system RAM via the front side bus. The interconnect 122 may be a parallel interconnect or may be a serial point-to-point interconnect such as those used in Peripheral Component Interconnect Express (PCIe) busses.

It is believed that substantial reduction in uneven frequency dependent loss may be achieved utilizing a package embedded passive equalizer in accordance with the present description. Such equalizers may be applicable to interconnects operating in the Gigabit range, including 8-10 Gigabits, for example. It is believed that it may be applicable to other frequencies in the Gigabit range including 12 or 15 Gigabits, for example. Although the interconnect 122 of the illustrated embodiment may provide a high-speed channel, it is appreciated that a package embedded passive equalizer in accordance with the present description is suitable for use with a variety of interconnects including lower-speed channels as well as high speed channels.

Figure 2:
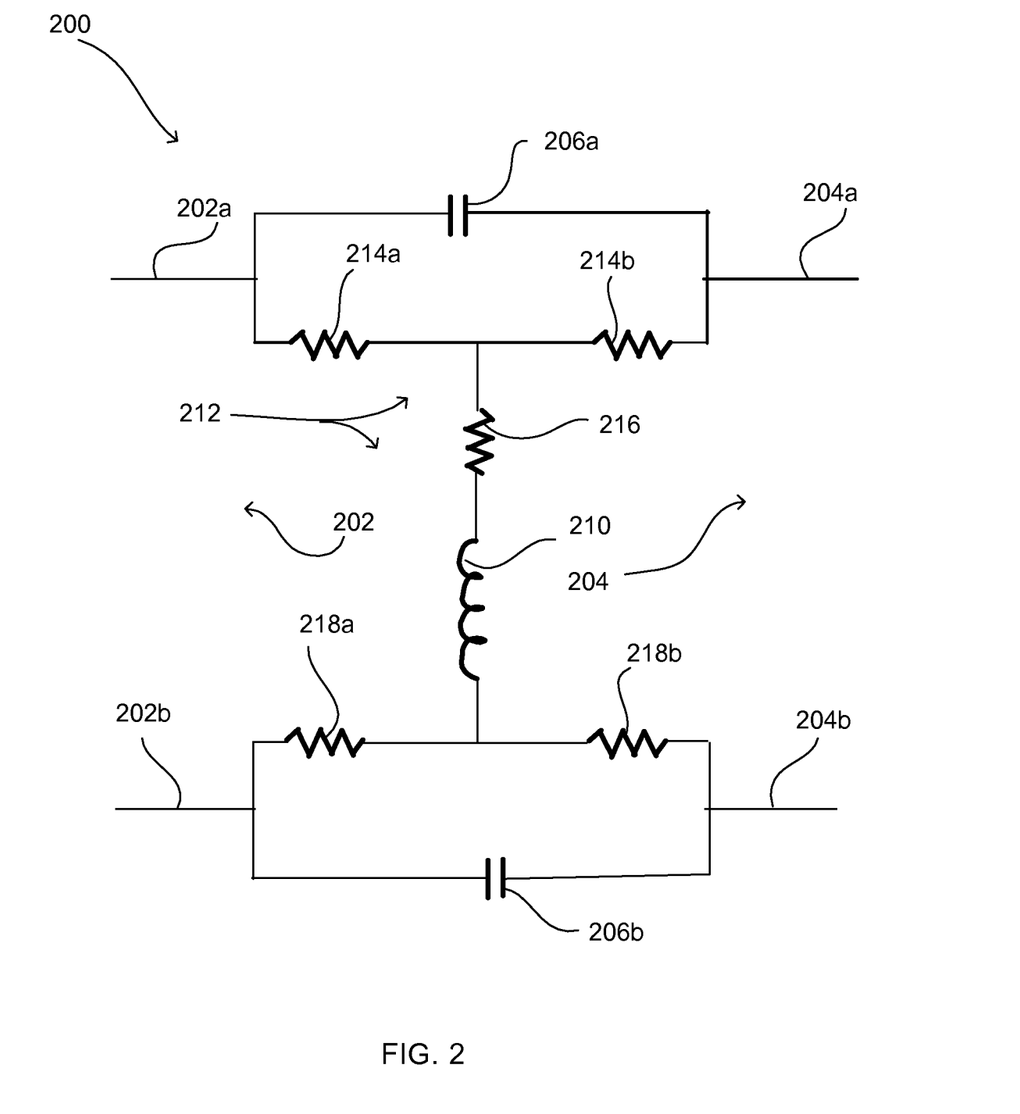
FIG. 2 is a schematic diagram of one embodiment of an equalizer circuit of the package embedded equalizer of FIG. 1.

FIG. 2 is a schematic electrical diagram of one example of an electrical circuit 200 for the package embedded passive equalizer of FIG. 1. The circuit 200 in this embodiment is a continuous-time linear equalizer (CLE), It is appreciated that other circuits having fewer or more passive components may be used in a package embedded passive equalizer in accordance with the present description.

In this example, in transmitting a signal from the output of the first integrated circuit of the first die 108 packaged in the first package 104, to the input of the second integrated circuit packaged in the second package 114, the signal is input at a differential input 202 which includes inputs 202a and 202b. The signal input from the integrated circuit 104 is conditioned by the circuit 200 of the package embedded passive equalizer 100 and is output at a differential output 204 which includes outputs 204a, 204b which are electrically coupled by the printed circuit board interconnect 122 (FIG. 1) to the second integrated circuit packaged in the second package 114.

Figure 3:
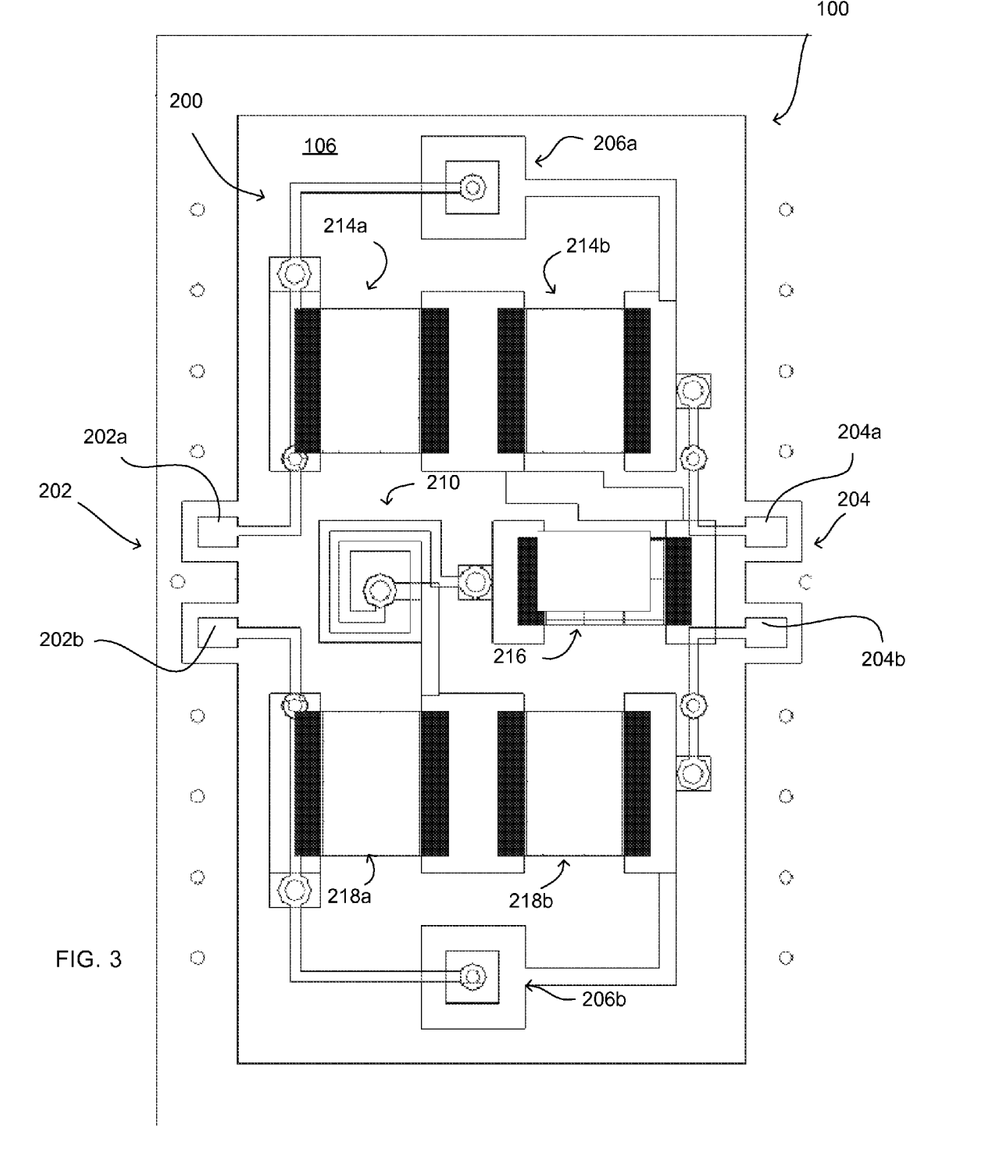
FIG. 3 is a top schematic view of one embodiment of the package embedded equalizer of FIG. 1.

FIG. 3 schematically shows in a top view one example of how the components of the circuit 200 may be arranged and embedded in the substrate 106 of a package. Thus, FIG. 3 shows one example of a layout of the inputs 202a, 202b and outputs 204a, 204b of the circuit 200.

Referring to FIGS. 1-3, in conditioning the signal input from the transmitting integrated circuit of the first die 108, the components of the differential input signal at differential input 202, are each coupled to one of a pair of parallel capacitors 206a, 206b, which substantially passes signals having a frequency above a predetermined frequency through the passive equalizer circuit 200 the differential output 204. The conditioned signal is output to the input of the receiver integrated circuit of the second die 114 via the printed circuit board interconnect 122. Conversely, each capacitor 206a, 206b substantially blocks signals having a frequency below the predetermined frequency from passing through the capacitors 206a, 206b.

The components of the differential input signal at differential input 202, are each also coupled to an inductor 210 which substantially passes signals having a frequency below a predetermined frequency to a voltage divider circuit 212. The component of the differential input signal input at input 202a is divided by resistors 214a, 214b, 216 and 218b which attenuates a signal having a frequency below the predetermined cutoff frequency of the inductor 210. Similarly, the component of the differential input signal input at input 202b is divided by resistors 218a, 218b, 216 and 214b which again attenuates a signal having a frequency below the predetermined cutoff frequency of the inductor 210. Conversely, the inductor 210 substantially blocks signals having a frequency above the predetermined cutoff frequency of the inductor 210.

In this manner, the CLE circuit 210 conditions the differential signal from the integrated circuit of the first die 108, by suppressing or attenuating low-frequency signals and passing high-frequency signals, in a manner similar to that of a high-pass filter, before passing the signal via the interconnect 122 to the integrated circuit of the second die 118.

In the illustrated embodiment, the circuit 200 is suitable for conditioning differential signals. It is appreciated that a package embedded passive equalizer in accordance with the present description may be adapted as a single-ended equalizer for use with nondifferential signals. Also, the circuit 200 has a particular termination, such as 85 ohm, for example, to match the impedance of the channel of the interconnect 122.

Still further, the circuit 200 is symmetrical in that signals may be input at the terminal 202, conditioned and output at the terminal 204, or conversely input at the terminal 204, conditioned and output at the terminal 202. It is appreciated that other package embedded passive equalizers in accordance with the present description may be nonsymmetrical. Also, in the illustrated embodiment, the characteristic impedance of the interconnect channel is matched from the input side (terminal 202, for example) and the output side (terminal 204, for example), thereby minimizing reflections. It is appreciated that other package embedded passive equalizers in accordance with the present description may be more susceptible or less susceptible to reflection.

The pass frequency of the capacitors 206a, 206b, and the cutoff frequency of the inductor 210, may be in a range of 1-10 GHz, for example, and may be the same or different. It is appreciated that other pass and cutoff frequencies may be selected, depending upon the particular application.

It is believed that a layout such as that depicted in FIG. 3 may consume on the order of approximately 1 to 7 mm$^2$. Accordingly, it is believed that a substantial number of such passive equalizers may be embedded within the area of a conventional sized substrate of a package for an integrated circuit such as a CPU. It is appreciated that the size of the layout of the equalizer may vary, depending upon the particular application.

Figure 4:
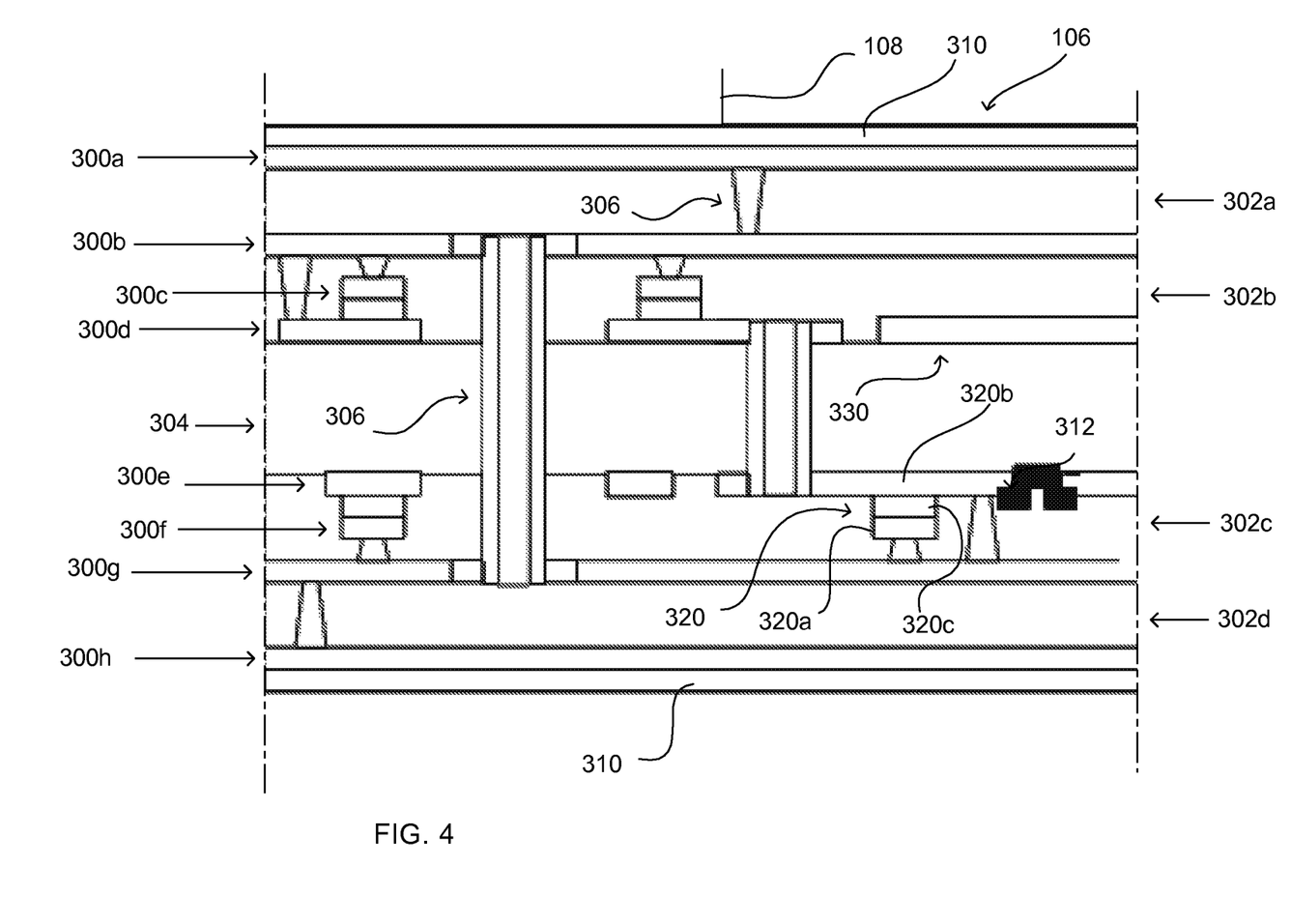
FIG. 4 is a cross-sectional schematic view of one embodiment of the package embedded equalizer of FIG. 1.

FIG. 4 is a schematic cross-sectional view of a portion of a package substrate such as the substrate 106, having a passive equalizer embedded in the substrate 106 of the package 104, in accordance with the present description. In this embodiment, the substrate 106 includes a plurality of conductive layers 300a, 300b . . . and a plurality of dielectric layers 302a, 302b, . . . interleaved between the conductive layers 300a, 300b . . . . The layers 300a, 300b . . . and 302a, 302b, . . . are formed on front and back sides of a core 304 which provides structural support for the layers 300a, 300b . . . and 302a, 302b, . . . of the substrate 106. Suitable protective layers 310, such as solder resist layers, for example, may be disposed on the front side and back side of the substrate 106.

Each layer of the conductive layers 300a, 300b . . . is formed of a suitable conductive material such as aluminum, copper, etc and may be etched or otherwise formed into separate conductors to interconnect the embedded components of the passive equalizer. The conductors of the individual conductive layers 300a, 300b . . . may be interconnected by conductive vertical structures 306 which may be vias or plated through holes, for example.

The substrate 106 includes an embedded resistor 312 formed at a conductive layer 300e. The resistor 312 which may be one of the resistors 214a, 214b, 216, 218a, 218b, for example, of the circuit 200 of FIGS. 2 and 3. The embedded resistors may be formed by depositing a suitable resistive material such as a carbon paste material, for example, having a suitable resistivity, such as 50-Ohm/sq, for example, in an opening between two or more conductors in one or more conductive layers.

The substrate 106 further includes an embedded capacitor 320 formed at a conductive layer 300e, dielectric layer 302c and conductive layer 300f. The capacitor 320 which may be one of the capacitors 206a, 206b, for example, of the circuit 200 of FIGS. 2 and 3. The plates 320a, 320b of the capacitor 320 may be etched or otherwise formed from conductive layers. The plates 320a, 320b may be parallel plates or have other configurations, depending upon the particular application.

A dielectric layer 320c may be deposited between the plates 320a, 320b. In the illustrated embodiment, the material of the dielectric layer 320c may be, for example, a ceramic-filled-polymer (CFP) material having a suitable dielectric constant. In this example, the dielectric constant of the dielectric layer 320b is about six times higher than the typical dielectric layers used for CPU packages. It is appreciated that the material and the properties of the material of the dielectric layer of the embedded capacitors may vary, depending upon the particular application.

The substrate 106 further includes an embedded inductor 330 formed at a conductive layer 300d, for example. The embedded inductor 330 may be the embedded inductor 210, for example, of the circuit 200 of FIGS. 2 and 3. As best seen in FIG. 3, the inductor 210 may have a spiral shape etched or otherwise formed from the conductive material of a conductive layer. The embedded inductor may have other shapes, depending upon the particular application.

In the illustrated embodiment, the substrate 106 has six conductive metal layers which is the number found in the package substrates of many conventional chipset and CPU packages, plus additional layers (300c, 300f) used for the implementation of the embedded capacitors 206a, 206b. The total thickness of the substrate 106 will vary, depending upon the particular application. It is anticipated that the thickness will be a millimeter or more for many applications. It is appreciated that other substrates having package embedded passive equalizer may have more or fewer layers, or greater or lesser thicknesses.

It is further appreciated that any of a variety of technologies may be employed to embed a passive equalizer in a package substrate. For example, a multi-layer organic (MLO) substrate may be utilized, which is fabricated by laminating thick epoxy-based resistor and capacitor films. For an MLO substrate, inductors and transmission lines may be formed by plating and etching of the conductive material, typically copper metal.

Another substrate which may be utilized is a low temperature co-firing ceramic (LTCC) substrate, which is fabricated by laminating thin ceramic green sheets and co-firing them at temperatures which are below 1000 degrees C. In this process, inductors and transmission lines are fabricated by screen printing of a thick film metal that typically has a high melting point, such as a film of silver and its alloys, onto the ceramic green sheet. The high dielectric constant (high-k) ceramic green sheets are laminated onto printed metal films to make parallel-plate capacitors.

As another example, multi-layer passive thin films may be deposited on either semi-conducting or non conducting substrates such as silicon, alumina, quartz, or GaAs substrates, for example. For such substrates, integrated circuit materials and processes are typically used to fabricate inductors, resistors, and capacitors. Such a substrate can achieve, it is believed a relatively small form factor but may result in increased processing and assembly costs.

In certain embodiments, a device or devices in accordance with the present description may be embodied in a computer system including a video controller to render information to display on a monitor coupled to the computer. The computer system may comprise a desktop, workstation, server, mainframe, laptop, handheld computer, cellular telephone, etc. Alternatively, a device or devices in accordance with the present description may be embodied in a computing device that does not include a video controller, such as a switch, router, etc.

Figure 5:
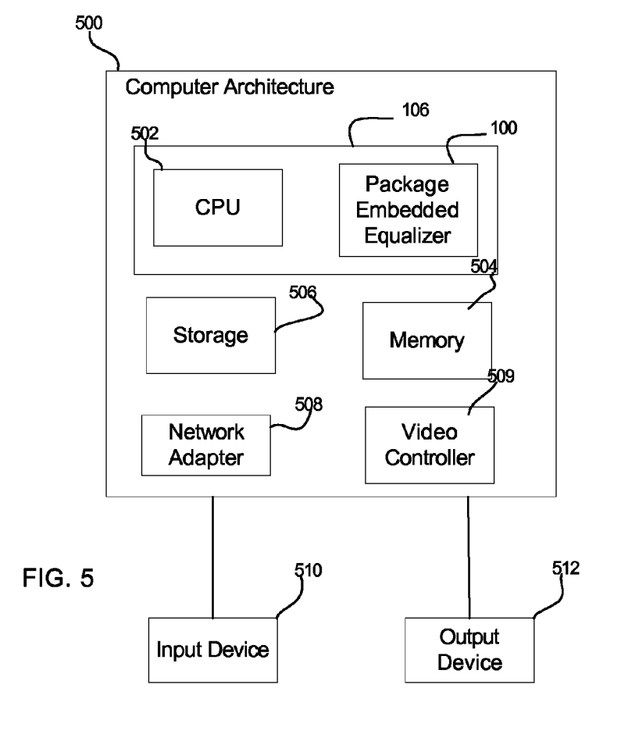
FIG. 5 is a schematic diagram of a computer system employing a package embedded equalizer in accordance with one embodiment of the present description.

FIG. 5 illustrates one embodiment of a device such as a computer architecture 500 which may employ integrated circuits having a package embedded passive equalizer in accordance with the present description. The architecture 500 may include a CPU or other processor 502 (e.g., a microprocessor) disposed on a package substrate 106 having embedded therein a passive equalizer 100. The architecture 500 may further include a memory 504 (e.g., a volatile memory device), and storage 506 (e.g., a non-volatile storage, such as magnetic disk drives, optical disk drives, a tape drive, etc.). The storage 506 may comprise an internal storage device or an attached or network accessible storage. Programs in the storage 506 are loaded into the memory 504 and executed by the CPU 502 in a manner known in the art. The architecture further includes a network controller 508 to enable communication with a network, such as an Ethernet, a Fibre Channel Arbitrated Loop, etc. Further, the architecture may, in certain embodiments, include a video controller 509 to render information on a display monitor, where the video controller 509 may be embodied on a video card or integrated on integrated circuit components mounted on the motherboard, for example. An input device 510 is used to provide user input to the CPU 502, and may include a keyboard, mouse, pen-stylus, microphone, touch sensitive display screen, or any other activation or input mechanism known in the art. An output device 512 is capable of rendering information transmitted from the processor 502, or other component, such as a display monitor, printer, storage, etc.

The foregoing description of various embodiments has been presented for the purposes of illustration and description. It is not intended to be exhaustive or to limit to the precise form disclosed. Many modifications and variations are possible in light of the above teaching.

What is claimed is:

1. A device, comprising:
   a printed circuit board; and
      an integrated circuit protective package which includes a substrate, said integrated circuit protective package being mounted on said printed circuit board, said integrated circuit protective package having a die supported by said integrated circuit package substrate, said die having a first integrated circuit packaged by said integrated circuit protective package so that said die is disposed within and protected by said integrated circuit protective package, and said integrated circuit protective package further having a passive equalizer circuit embedded within said integrated circuit protective package substrate supporting said die and electrically coupled to said first integrated circuit of said die.

2. The device of claim 1 further comprising a second integrated circuit, and wherein said printed circuit board has an interconnect disposed on said printed circuit board and electrically coupling said first and second integrated circuits wherein said embedded passive equalizer circuit is electrically coupled to said printed circuit board interconnect and is adapted to compensate frequency dependent signal loss on said interconnect.

3. The device of claim 2 wherein said first integrated circuit is a central processing unit, and wherein said device is a computer system further comprising:
   a memory coupled to said central processing unit;
   a video controller coupled to said central processing unit;
   storage coupled to said central processing unit;
   an input device coupled to said central processing unit; and
   an output device coupled to said central processing unit.

4. The device of claim 1 wherein said integrated circuit protective package substrate has a plurality of layers of conductive material and a plurality of layers of dielectric material, each layer of dielectric material being disposed between two adjacent layers of conductive material.

5. The device of claim 4 wherein said passive equalizer circuit includes an inductor embedded in said integrated circuit protective package substrate, said inductor comprising a spiral shaped conductor formed by a portion of one conductive layer of said integrated circuit protective package substrate.

6. The device of claim 5 wherein said passive equalizer circuit includes a resistor embedded in said integrated circuit protective package substrate, said resistor comprising a member formed of resistive material and electrically coupled to at least a portion of one conductive layer of said integrated circuit protective package substrate.

7. The device of claim 4 wherein said passive equalizer circuit includes a capacitor embedded in said integrated circuit protective package substrate, said capacitor comprising a pair of parallel plates and a dielectric layer between the parallel plates, wherein at least a plate is formed by a portion of one conductive layer of said integrated circuit protective package substrate.

8. The device of claim 1 wherein said integrated circuit protective package substrate comprises one of a ceramic material and an organic material.

9. A method, comprising:
   transmitting a signal from the output of a first integrated circuit on a first die packaged within and protected by a first integrated circuit protective package mounted on a printed circuit board, to the input of a second integrated circuit on a second die packaged within and protected by a second integrated circuit protective package;
   wherein said transmitting includes conditioning said signal using a passive equalizer circuit embedded in a package substrate of one of said first and second integrated circuit protective packages, said package substrate supporting one of said first and second dies of said one of said first and second integrated circuit protective packages.

10. The method of claim 9 wherein said transmitting includes transmitting said signal along an interconnect disposed on said printed circuit board and electrically coupling said output of said first integrated circuit to said input of said second integrated circuit.

11. The method of claim 10 wherein said conditioning includes coupling said signal to a capacitor of said passive equalizer circuit wherein said capacitor substantially passes signals having a frequency above a predetermined frequency through said passive equalizer circuit to said input of said second integrated circuit, and substantially blocks signals having a frequency below said predetermined frequency.

12. The method of claim 11 wherein said conditioning includes coupling said signal to an inductor wherein said inductor substantially passes signals having a frequency below a second predetermined frequency to a voltage divider circuit, and substantially blocks signals having a frequency above said second predetermined frequency.

13. The method of claim 12 wherein said conditioning includes attenuating a signal having a frequency below said second predetermined frequency and passing said attenuated signal through said passive equalizer circuit to said input of said second integrated circuit.

14. The method of claim 9 wherein said package substrate comprises one of a ceramic material and an organic material.

15. A method, comprising:
   embedding a passive equalizer circuit within a protective package substrate;
   positioning a die having a first integrated circuit so that the die is supported by the protective package substrate;
   electrically coupling the integrated circuit of the die to the passive equalizer circuit embedded within the protective package substrate; and
   packaging the die within a protective package which includes the protective package substrate so that the die is disposed within and protected by the protective package.

16. The method of claim 15 further comprising:
   mounting the protective package to a printed circuit board having interconnects; and
   electrically coupling the integrated circuit of the die and the passive equalizer circuit embedded within the protective package substrate, to interconnects of the printed circuit board.

17. The method of claim 15 further comprising electrically coupling a second integrated circuit to a printed circuit board interconnect disposed on said printed circuit board and electrically coupled to said embedded passive equalizer circuit, and compensating frequency dependent signal loss on the interconnect coupled to the second integrated circuit using the embedded passive equalizer circuit.

18. The method of claim 15 wherein said protective package substrate has a plurality of layers of conductive material and a plurality of layers of dielectric material, each layer of dielectric material being disposed between two adjacent layers of conductive material.

19. The method of claim 18 wherein said embedding a passive equalizer circuit includes embedding a capacitor in said protective package substrate, said capacitor comprising a pair of parallel plates and a dielectric layer between the parallel plates, wherein at least a plate is formed by a portion of one conductive layer of said protective package substrate.

20. The method of claim 18 wherein said embedding a passive equalizer circuit includes embedding an inductor in said protective package substrate, said inductor comprising a spiral shaped conductor formed by a portion of one conductive layer of said protective package substrate.

21. The method of claim 20 wherein said embedding a passive equalizer circuit includes embedding a resistor in said protective package substrate, said resistor comprising a member formed of resistive material and electrically coupled to at least a portion of one conductive layer of said protective package substrate.

* * * * *